United States Patent [19]
Williams

[11] Patent Number: 5,412,239
[45] Date of Patent: May 2, 1995

[54] CONTACT GEOMETRY FOR IMPROVED LATERAL MOSFET

[75] Inventor: Richard K. Williams, Cupertino, Calif.

[73] Assignee: Siliconix incorporated, Santa Clara, Calif.

[21] Appl. No.: 62,507

[22] Filed: May 14, 1993

[51] Int. Cl.⁶ .............................. H01L 23/48
[52] U.S. Cl. ........................ 257/343; 257/401; 257/758; 257/750; 257/774; 257/775; 257/776
[58] Field of Search ............. 257/343, 774, 776, 401, 257/750, 758, 775

[56] References Cited

U.S. PATENT DOCUMENTS

| | | | |
|---|---|---|---|
| 4,012,764 | 3/1977 | Satonaka | 257/776 |
| 4,196,443 | 4/1980 | Dingwall | 257/774 |
| 4,951,101 | 8/1990 | Alter et al. | 257/774 |

*Primary Examiner*—Edward Wojciechowicz
*Attorney, Agent, or Firm*—Skjerven, Morrill, MacPherson, Franklin & Friel; David E. Steuber

[57] ABSTRACT

A geometry for the metal contacts in a lateral MOSFET is disclosed. The cross-sectional shape of the metal contacts, which is usually six-sided but may also be a parallelogram, maximizes the cross-sectional area of the contacts while maintaining a required clearance from the gate layer and a required overhang of the lines in an overlying metal layer.

15 Claims, 13 Drawing Sheets

FIG. 6A    p type

CONTACT GEOMETRY FOR IMPROVED LATERAL MOSFET

FIELD OF THE INVENTION

This invention relates to lateral MOSFETs, and in particular, to an improved technique for establishing the contact between a metal layer and the source and drain cells of the MOSFET.

BACKGROUND OF THE INVENTION

Figure 1:
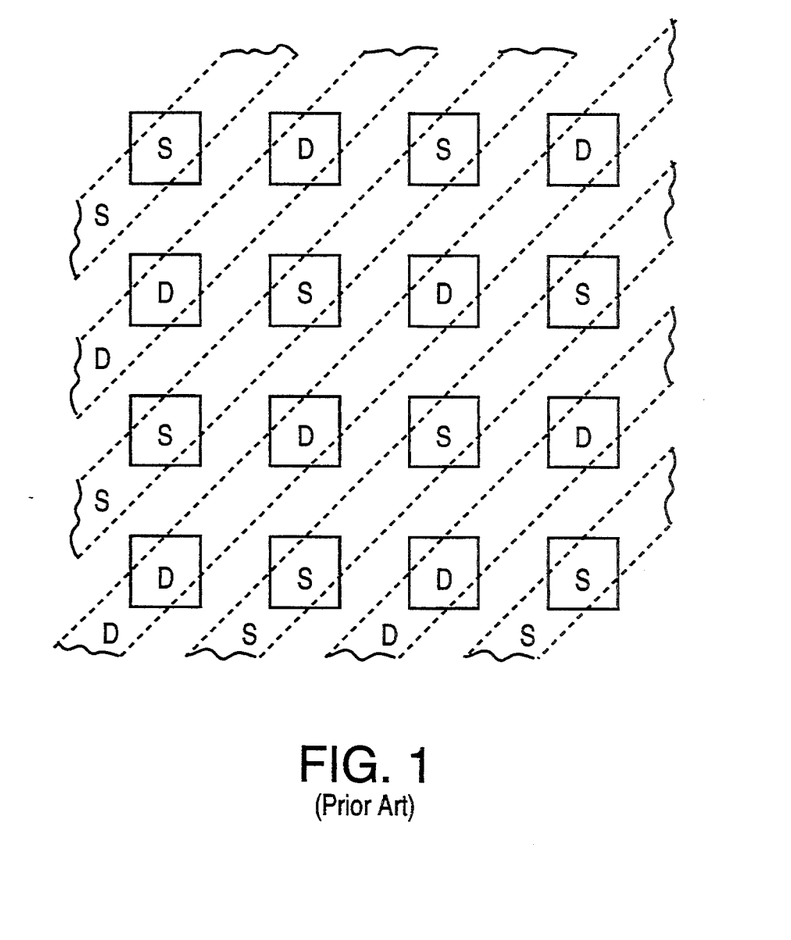
FIG. 1 illustrates the layout of source and drain cells in a typical lateral MOSFET.

In a lateral MOSFET, the source and drain diffusions are located on a single surface of a semiconductor substrate. While lateral MOSFETs can be constructed of long alternating stripes of source and drain regions separated by a gate stripe, it is well known that a closed cell arrangement typically provides a lower on-resistance in a given area. In such closed cell lateral MOSFET designs the cells are arranged in rows and columns as shown in FIG. 1, wherein cells alternate between source and drain regions in both columns and rows. Source and drain metal interconnection lines are then deposited diagonally, such that the source and drain metal lines alternate with one another across the face of the chip.

Figure 2A:
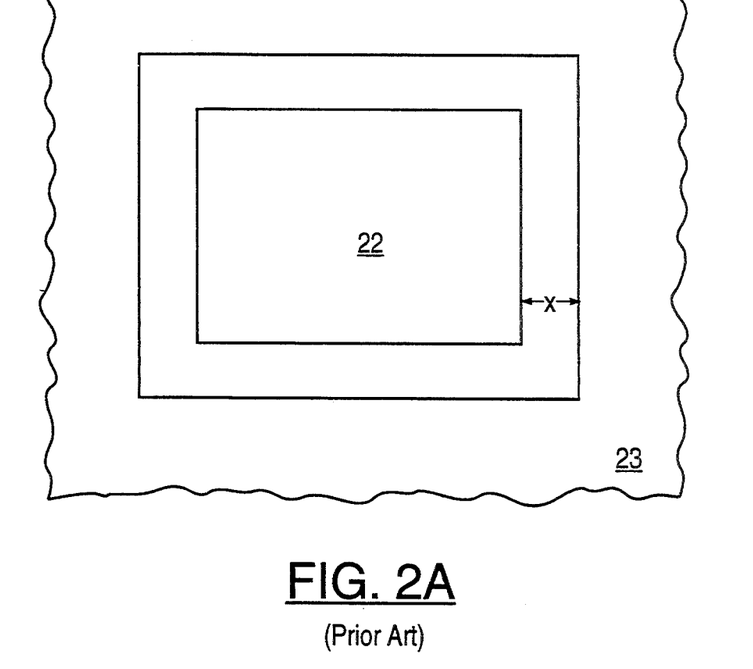
FIGS. 2A and 2B illustrate top plan and cross-sectional views, respectively, of a cell in a typical lateral MOSFET.
Figure 2B:
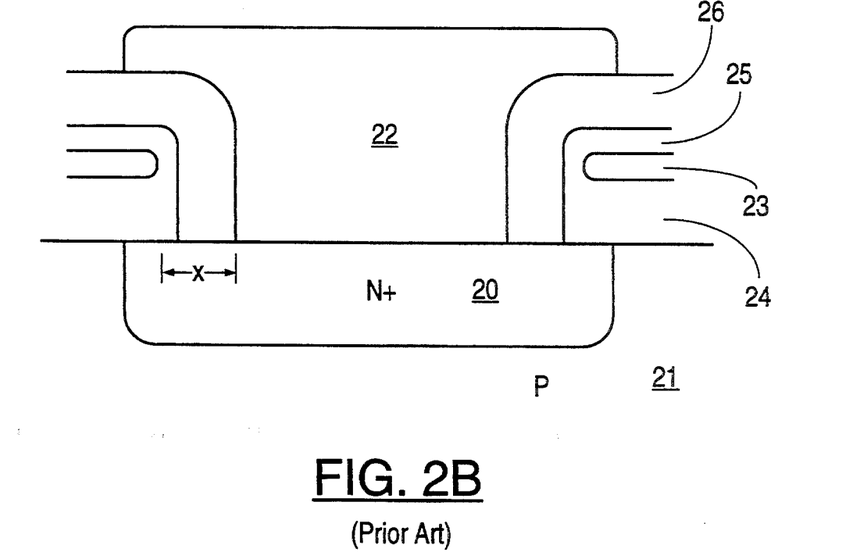

FIGS. 2A and 2B illustrate top and cross-sectional views, respectively, of a typical cell. In this example, a diffusion 20 of N+ type material is made in a P substrate 21. The N+ diffusion is accessed by a metal contact 22. The metal contact 22 is surrounded laterally by a layer of gate material 23, typically polysilicon, which is separated from the top surface of substrate 21 by a gate oxide layer 24. A thermal oxide layer 25 and a thick oxide layer 26 separate the polysilicon gate 23 from the metal contact 22.

To prevent a short between metal contact 22 and polysilicon gate 23, which would destroy the MOSFET, a minimal clearance, shown as "x" in FIGS. 2A and 2B, must maintained between them. If this minimal distance is not maintained, errors in alignment, for example, may create a short between the metal contact and the gate. A typical value of x is 1 μm. To minimize the on-resistance of the transistor, it is desirable to have the cross-sectional area of the metal contact 22 be as large as possible for a given size opening in the gate. Therefore, assuming that the opening in the polysilicon gate is a square, the cross-section of metal contact 22 would ordinarily be a smaller square separated from the gate by the minimal distance x on all sides.

Figure 3:
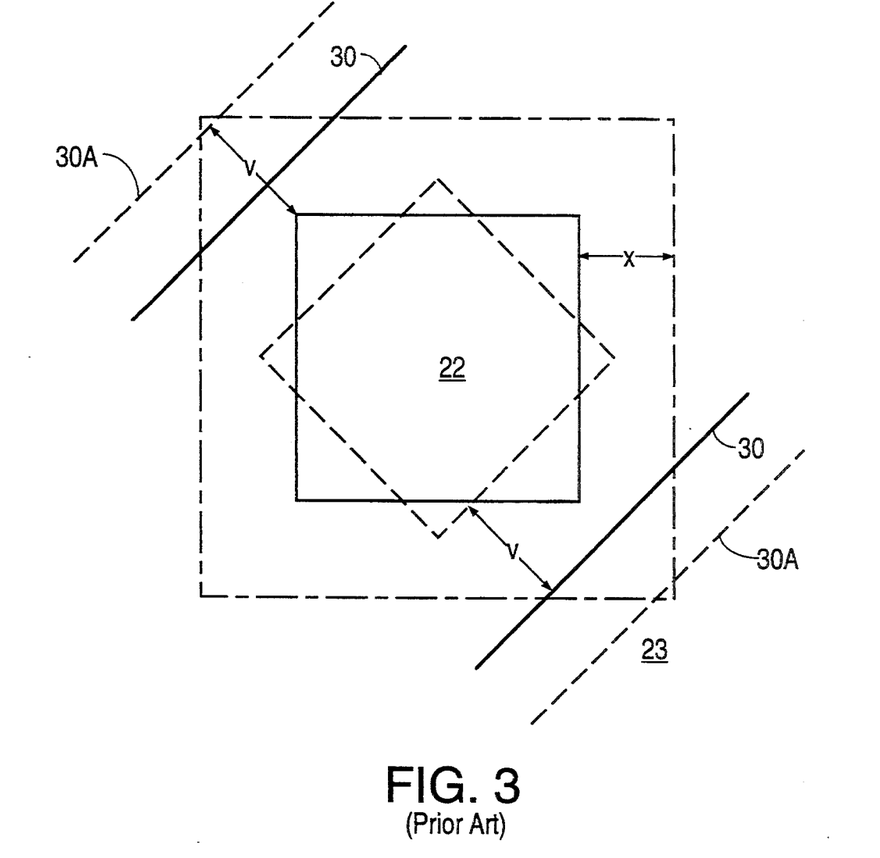
FIG. 3 illustrates a top plan view of a junction between a metal contact and a diagonal metal line.

FIG. 3 is a top plan view of a junction between the metal contact 22 and one of the diagonal metal lines, designated by the reference numeral 30, which illustrates the problem that occurs at this location. Metal contact 22 should be spaced at least a minimal distance from the edge of metal line 30, a distance which is designated as "v" in FIG. 3. Otherwise, a slight misalignment of the metal line may expose the contact. If the metal line does not cover the contact, then subsequent processing may etch holes through the silicon, destroying the junction and shorting out the device. It is well known that no portion of contact 22 should be left uncovered by metal line 30. As is evident from FIG. 3, metal 30 would have to be widened (see dashed lines 30A) to maintain the required separation between metal contact 22 and the edges of the meal line. This would very likely require that the source and drain cells be spaced further apart than is desirable fore minimizing the on-resistance of the MOSFET.

Alternatively, the minimal distance v could be maintained by rotating metal contact 22 through a 45° angle (as shown by the dashed lines). However, this will result in metal contact 22 being closer than the minimal distance x to the polysilicon gate 23. (The opening in gate 23 is illustrated by the dotted and dashed line in FIG. 3.)

In the metal contact structure of this invention, the cross-sectional area of the metal contact is maximized, while the minimal clearance between both the edge of the gate and the edge of a diagonal metal line is maintained.

SUMMARY OF THE INVENTION

According to this invention, a metal contact to a region of a lateral MOSFET is structured such that its corners which face the edges of an overlying diagonal metal line are truncated. This maximizes the cross-sectional area of the contact while maintaining minimal clearance between the edges of the gate and the metal line. The cross-sectional shape of metal contact is normally rectangular. By truncating the two opposite corners, a six-sided figure is formed, although the sides of the figure are not necessarily equal. In an extreme case, if the truncation goes all the way back to an adjacent corner of the rectangle, a parallelogram is formed.

This technique can be used in various types of MOSFETs, including those which have a body contact region separated from the source and drain cells, those which have a body contact region within each source cell, and those in which the drain cells are smaller than the source cells.

This technique can also be used in configuring vias which extend between diagonal metal lines and an overlying metal layer.

DESCRIPTION OF THE INVENTION

Figure 4:
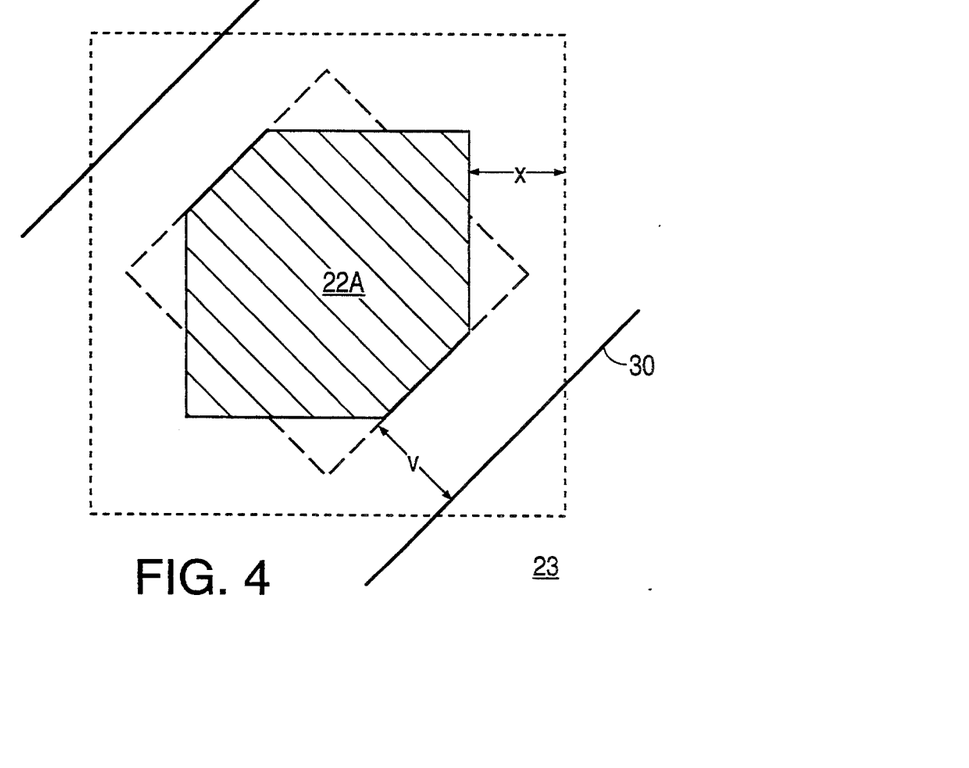
FIG. 4 illustrates the six-sided cross-sectional shape of a metal contact in accordance with the invention.

FIG. 4 illustrates a top view of a metal contact in accordance with this invention. Metal contact 22A is similar to contact 22 (FIG. 3) except that the corners of the contact facing the edges of diagonal metal line 30 have been truncated. Thus the minimal distance x between the metal contact and the polysilicon gate 23 and the minimal distance v between the metal contact and the edge of metal line 30 have been maintained, while the cross-sectional area of metal contacts 22A has been maximized. Maximizing the cross-sectional area of metal contact 22A helps to minimize the on-resistance of the MOSFET. Truncating the corners of metal contact 22A eliminates the need to widen metal line 30. Although a wide metal line is desirable to minimize the metal line's contribution to the MOSFET's resistance and to maximize its current handling capability, a wide metal line is only desirable when it does not require larger spacings between devices. In a MOSFET, it is known that $$R_{ds} \alpha \frac{L}{W}$$

where $R_{ds}$ is the on-resistance of the MOSFET, L is the distance separating the sources and the drains (i.e., the channel length), and W is the total length of all drain edges which face sources. Avoiding the need to widen the metal line 30 allows one to maintain the cell separation L at a desired value, whereas if metal line 30 were widened the effect would be to increase L. Thus the overall effect of truncating the corners of metal contact 22A is to maintain $R_{ds}$ at an minimum value.

Figure 5:
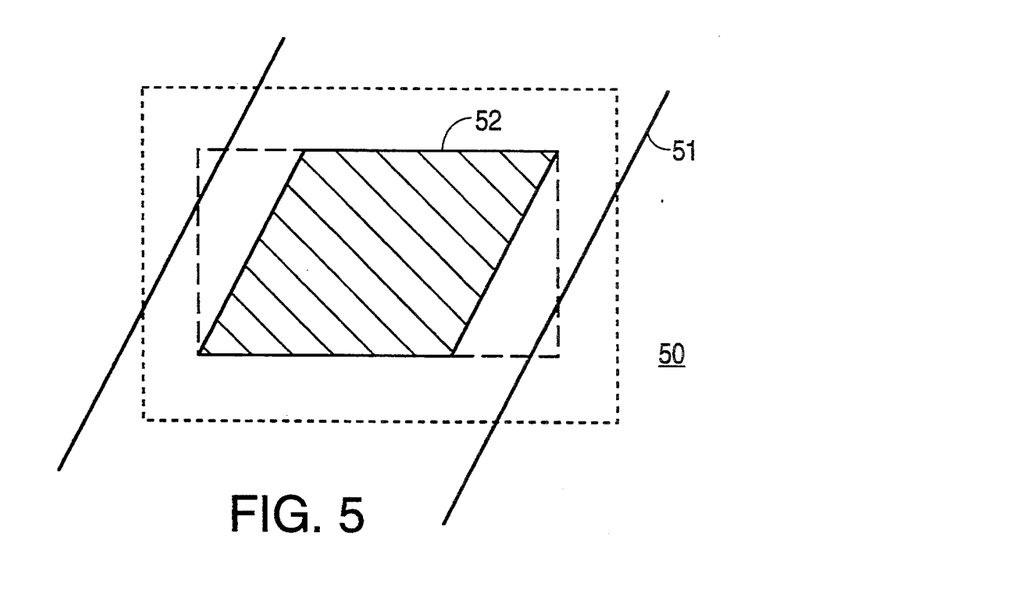
FIG. 5 illustrates an alternative metal contact in accordance with the invention, whose cross-sectional shape is a parallelogram.

The principles of this invention can be applied whether or not the diagonal metal lines are at a 45° angle with respect to the columns and rows of cells, and whether the opening in the gate layer is square or rectangular, or any other polygonal shape. FIG. 5 illustrates a gate layer 50 which has a rectangular opening and a metal line 51 which is oriented at an oblique angle other than 45° to the sides of the gate opening. As is apparent, in this situation truncating the corners of metal contact 52 may yield the shape of a parallelogram.

The broad principles of this application are applicable to a wide variety of lateral MOSFETs. FIGS. 6–10 illustrate several of these possibilities.

Figure 6A:
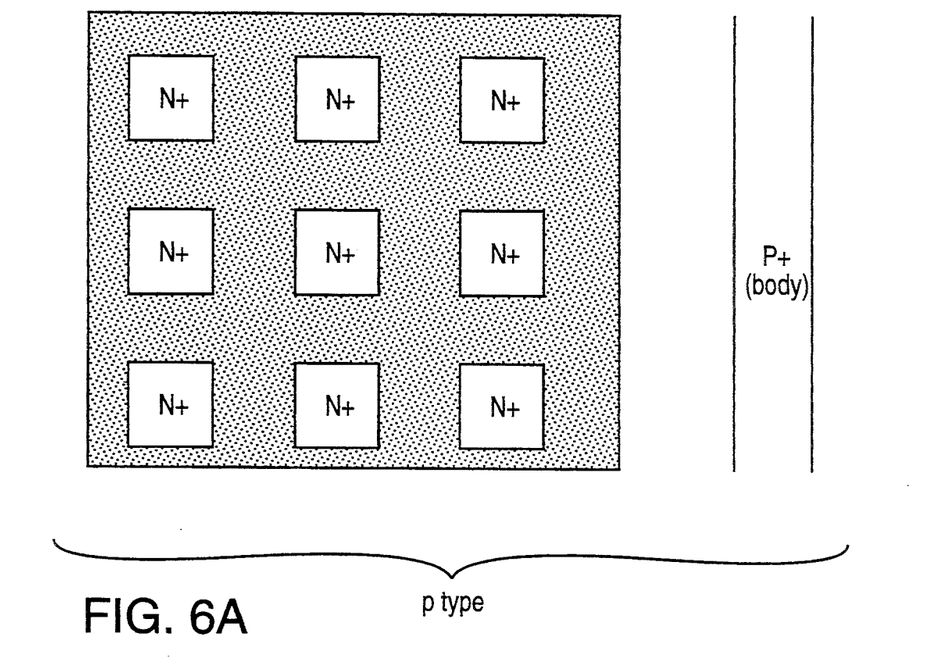
FIGS. 6A and 6B illustrate a top plan view and a perspective view, respectively, of a conventional lateral MOSFET without a local source/body short.
Figure 6B:
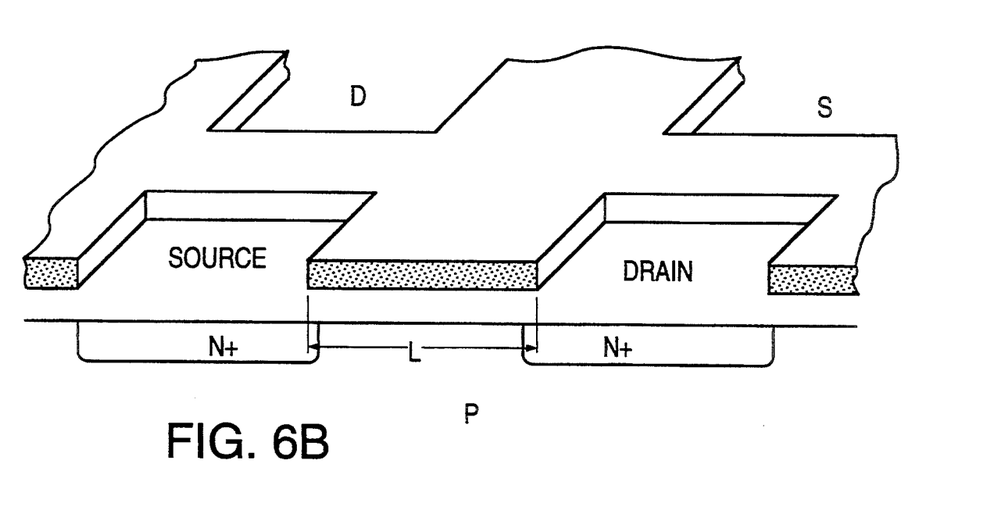

FIG. 6A illustrates a top plan view and FIG. 6B illustrates a perspective view of a conventional lateral MOSFET with a remote body contact region. In this embodiment, the source and drain cells include N+ diffusions in a P substrate, and a P+ body contact diffusion is formed at the edge of the MOSFET. Whether or not the body is shorted to the source electrically depends on the circuit application. In any event, providing a P+ diffusion only at the periphery reduces cell size and thereby improves on-resistance (i.e., more cells/area).

Figure 7A:
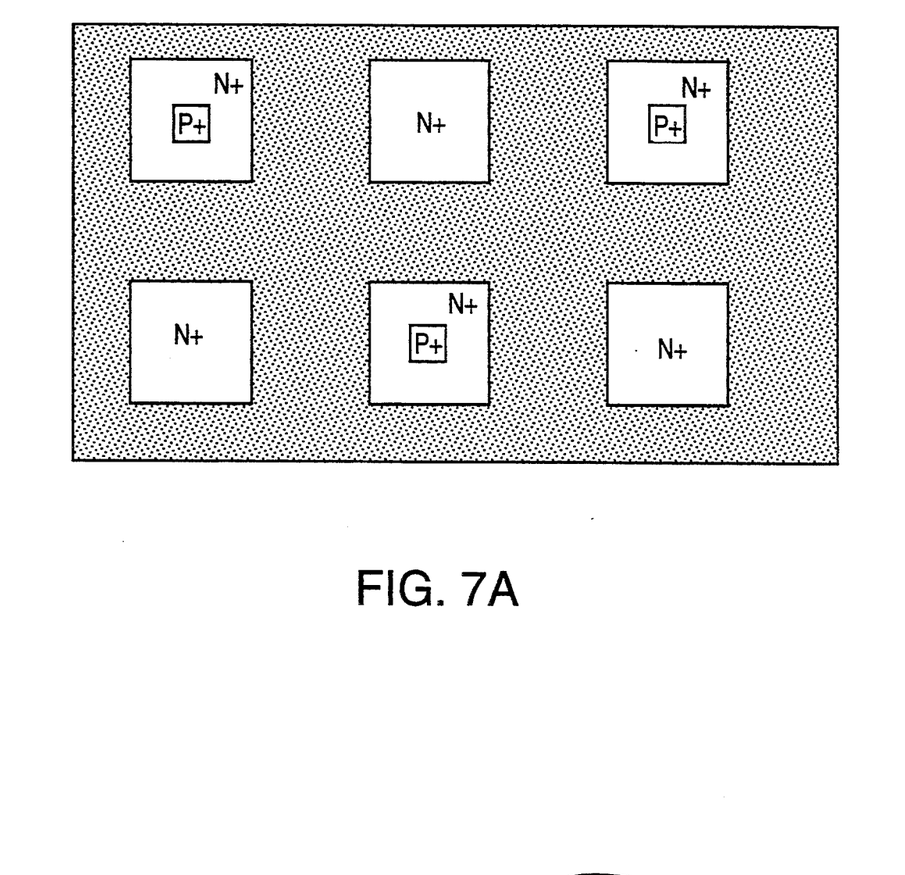
FIGS. 7A and 7B illustrate a top plan view and a perspective view, respectively, of a conventional lateral MOSFET with a local source/body short.
Figure 7B:
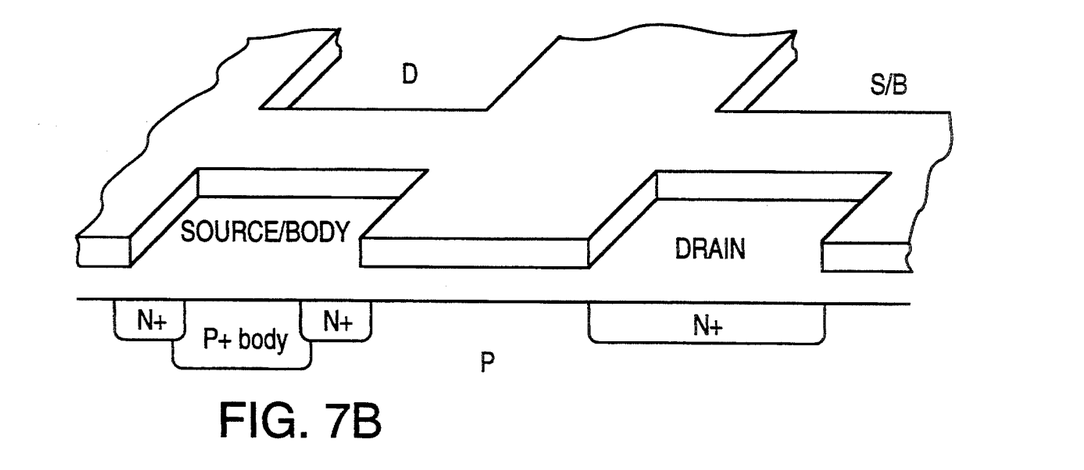

FIG. 7A illustrates a top plan view and FIG. 7B a perspective view of a MOSFET which has a local P+ body contact region in each source cell. The source and body regions must be shorted, and this requires a larger metal contact than the source cells in the embodiment of FIGS. 6A and 6B.

Figure 8A:
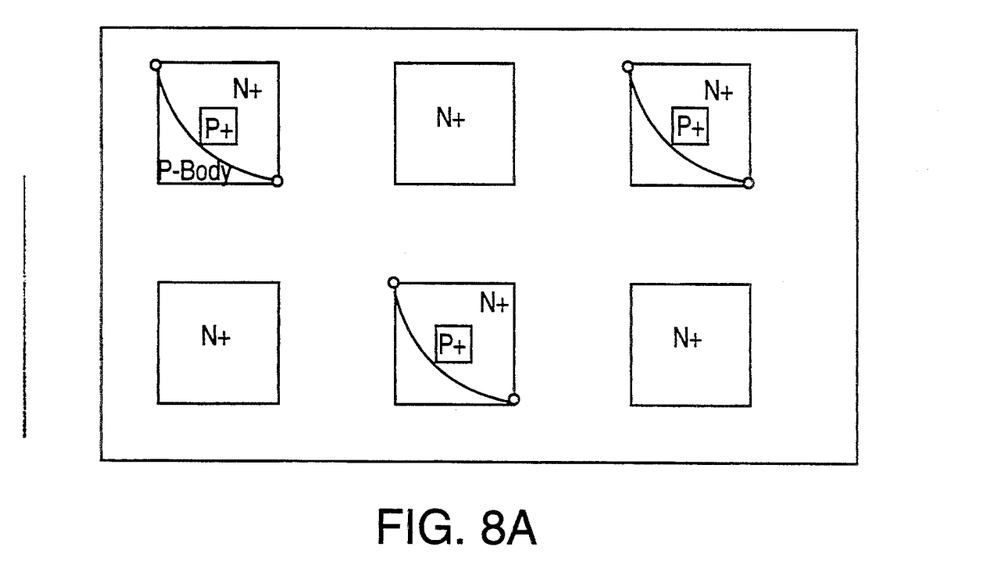
FIGS. 8A and 8B illustrate a top plan view and a perspective view, respectively, of a drain-enclosed lateral DMOS with a local source/body short.
Figure 8B:
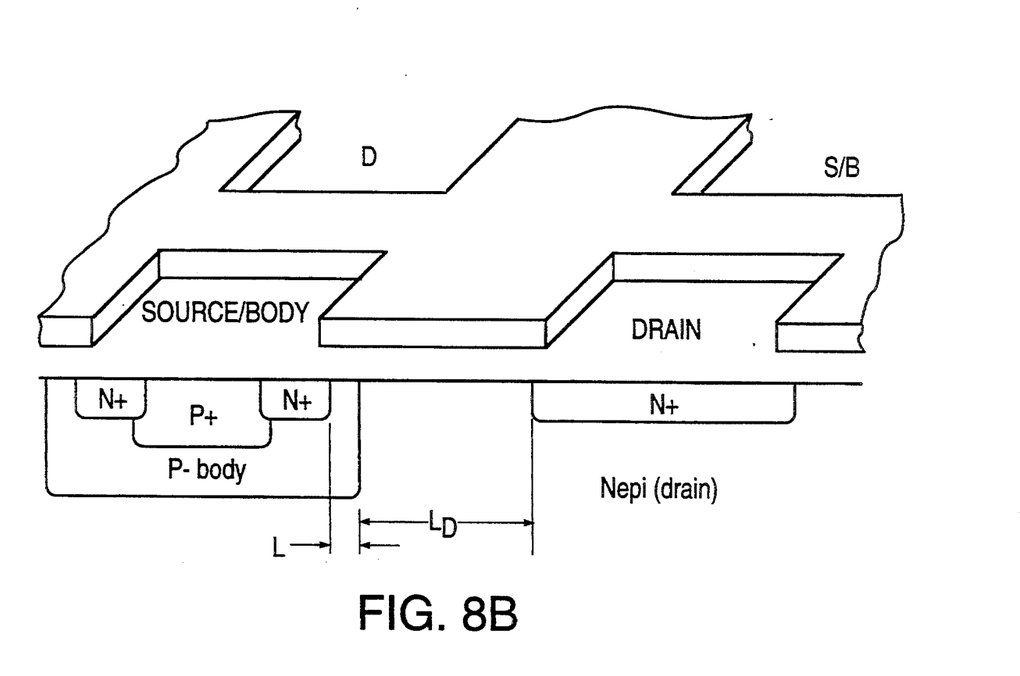
Figure 9:
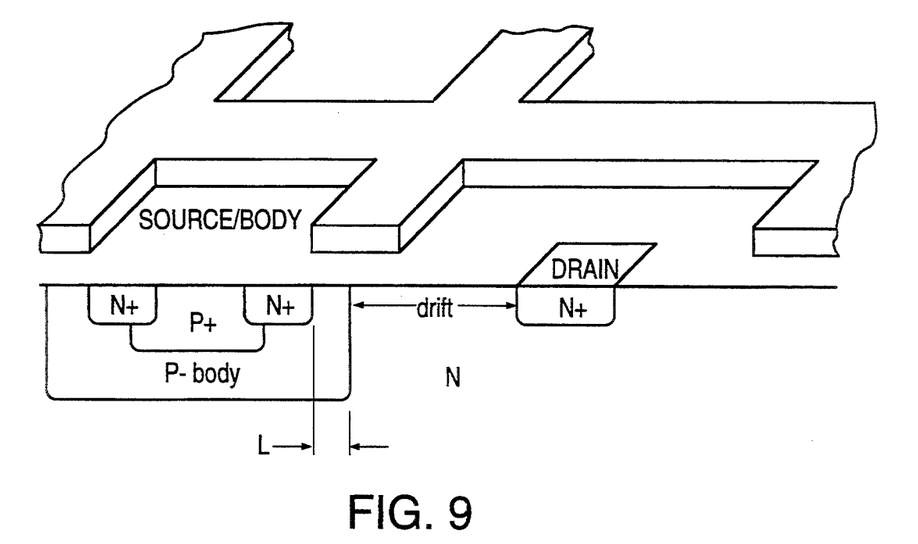
FIG. 9 illustrates a perspective view of a drain-enclosed lateral DMOS wherein the gate layer does not extend the entire distance between the drain and the source/body cells.

FIG. 8A illustrates a top plan view and FIG. 8B a perspective view of a drain-enclosed, lateral double diffused MOSFET (DMOS). In this embodiment, the substrate is N-type material, and the channel is formed in the P body region, which extends under the gate. Here the total distance between the cells is the summation of the width of the channel region (L) and the width ($L_D$) of a "drift" region which extends between the drain and the P body region. The metal contact must create a short between the source and body regions in each source/body cell. FIG. 9 illustrates a perspective view of a lateral DMOS in which the gate does not cover the entire area between the source/body region and the drain region, i.e., the "drift" region is left largely uncovered by the gate. This reduces the electric field in the drift region, with the result that this embodiment allows a higher voltage than the embodiment shown in FIGS. 8A and 8B.

Figure 10:
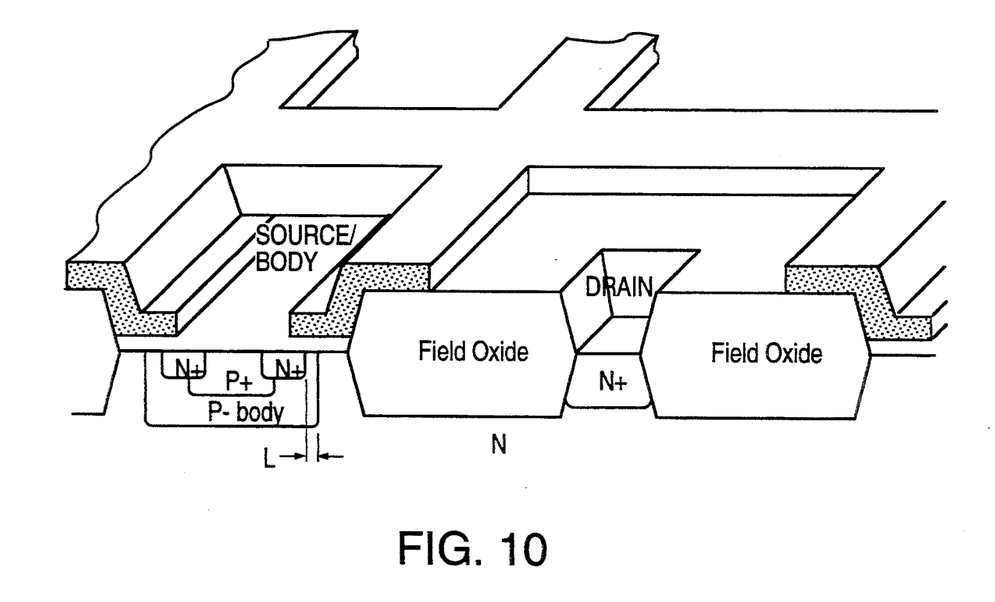
FIG. 10 illustrates a drain-enclosed lateral DMOS in which the gate layer extends partially over a field oxide layer.

FIG. 10 illustrates a perspective view of an embodiment similar to that shown in FIG. 9, except that the gate extends over a relatively thick field oxide. This further increases the capability of the MOSFET to withstand high voltages.

Figure 11:
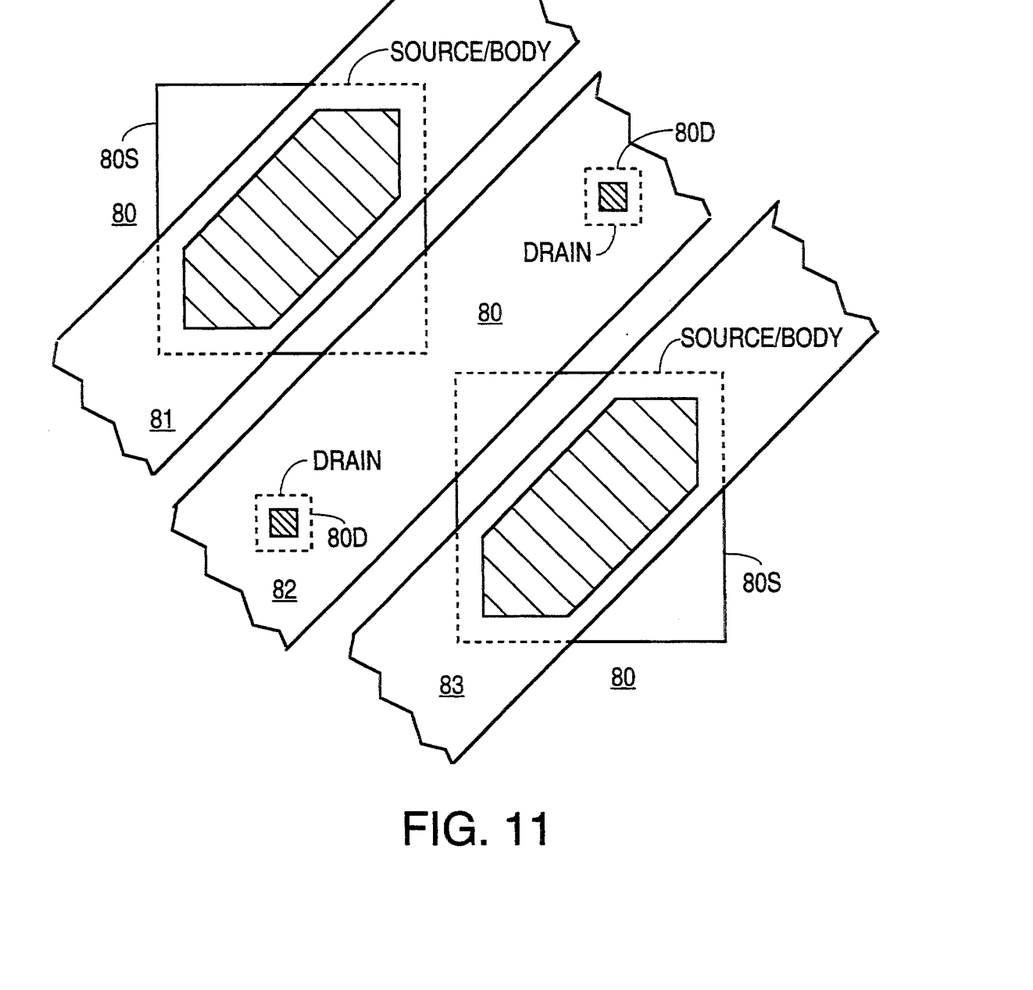
FIG. 11 illustrates a plan view of a lateral MOSFET in which the source/body cells are larger than the drain cells.

In the embodiment shown in FIG. 6, the metal contacts to the source and drain cells are essentially the same size. In the embodiments shown in FIGS. 7–10, however, the metal contacts extending to the source/body regions are normally somewhat larger than those which contact the drain regions. This type of arrangement is illustrated generally in the top view of FIG. 11, where a gate layer 80 has large openings 80S for the source/body cells and small openings 80D for the drain cells. Metal lines 81, 82 and 83 intersect the cells diagonally. The cross hatching indicates the metal contacts. As is apparent, the metal contacts in the source/body cells must be truncated to maintain a minimal distance from the edges of the metal lines whereas the metal contacts in the drain cells need not be truncated.

Figure 12:
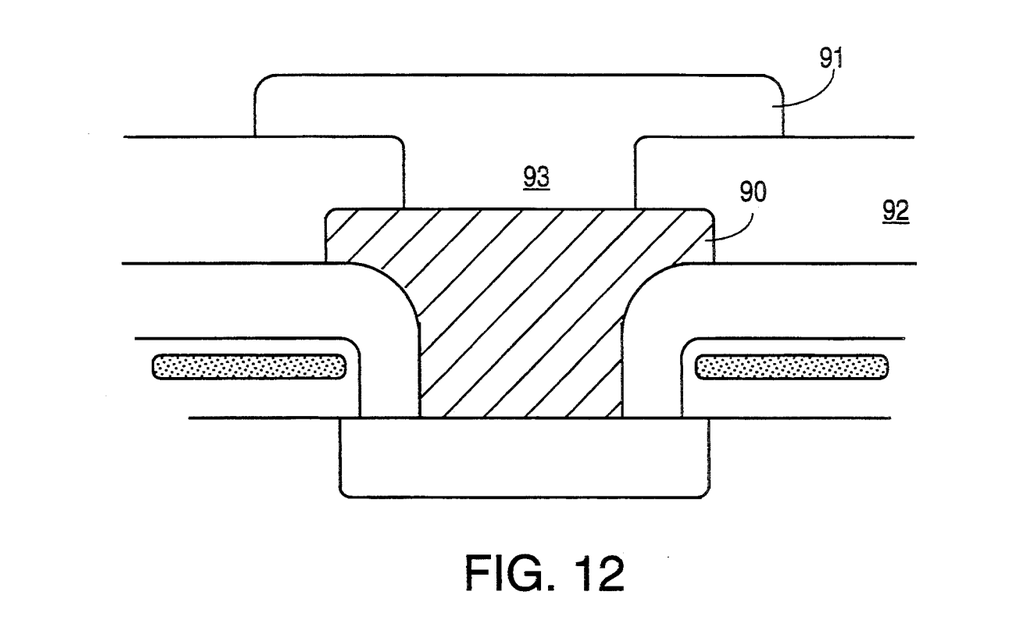
FIG. 12 illustrates a cross-sectional view of a lateral MOSFET cell including two overlying metal layers.
Figure 13:
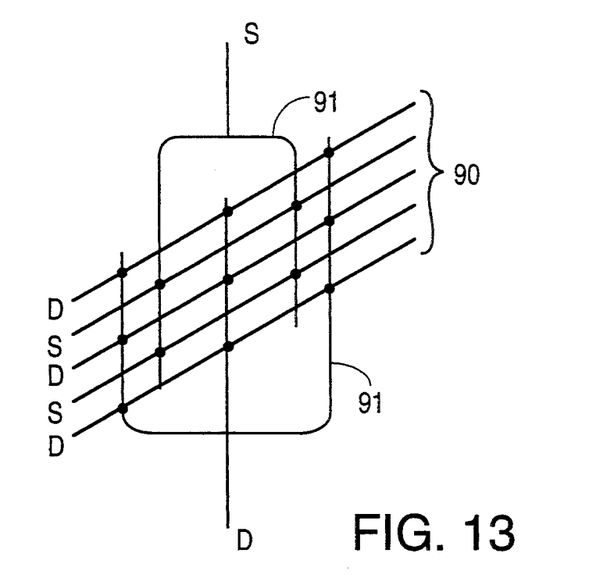
FIG. 13 illustrates a general plan view of the two metal layers.

It is common to have a second metal layer above the diagonal metal lines. This overlying metal layer is separated from the metal lines by a dielectric except at locations where vias extend through the dielectric layer to allow contact between the two metal layers. A cross-sectional view of this structure is illustrated in FIG. 12 which shows a first metal layer 90 separated from a second layer 91 by a dielectric layer 92. A via 93 extends through dielectric layer 92 to make contact between metal layers between 90 and 91. Although in FIG. 12 via 93 is shown directly over the metal contact for purposes of illustration, in general it is common for the via to be spaced apart from the contact. FIG. 13 illustrates how contact might be made between diagonal lines of metal layer 90 and vertical lines of metal layer 91 to provide connections to drain and source terminals at the edges of the MOSFET. (The location of the vias are indicated by dots.)

Figure 14A:
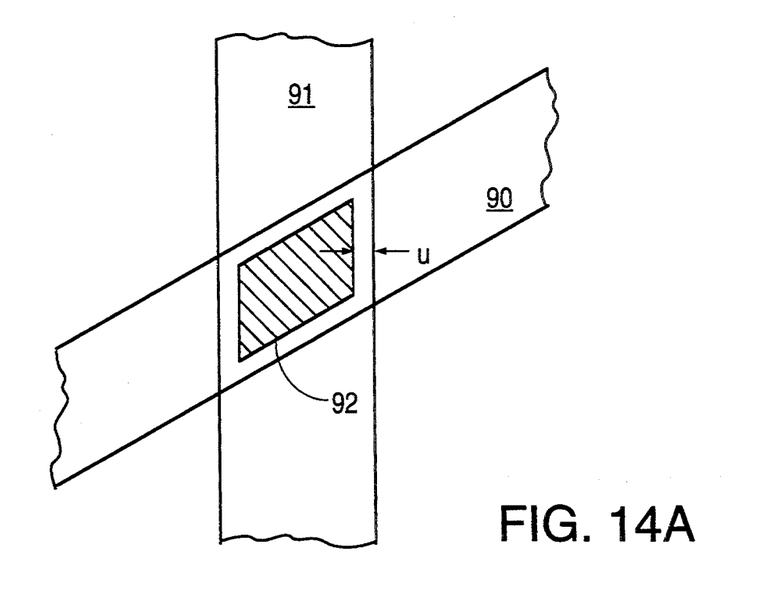
FIGS. 14A and 14B illustrate detailed plan views of a via between lines in the two metal layers.
Figure 14B:
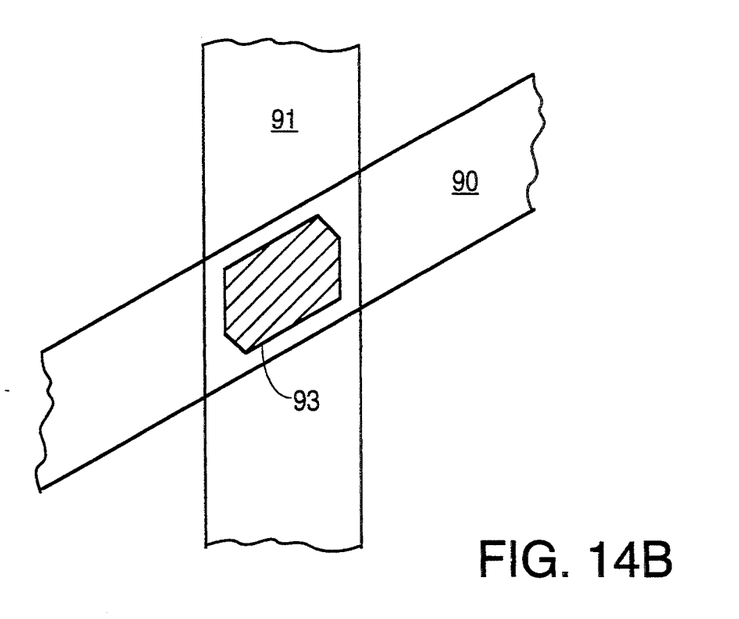

FIG. 14A illustrates a detailed top view of a single intersection between a diagonal line of metal layer 90 and a vertical line of metal layer 91. A via 92 connects the two metal lines. As with the metal contact described above, it is important that via 92 not be left uncovered by errors of alignment or etching. Therefore, a margin "u" should be maintained between the edges of lines 90 and 91 and the perimeter of via 92. As FIG. 14A indicates, this yields a via whose cross-section is in the shape of a parallelogram. Alternatively, FIG. 14B illustrates a via 93 having a six-sided shape similar to the one shown previously for use with a contact. The advantage of a six-sided shape over the parallelogram of FIG. 14A is that it avoids acute angles, which may complicate the manufacture of transistors.

Figure 15:
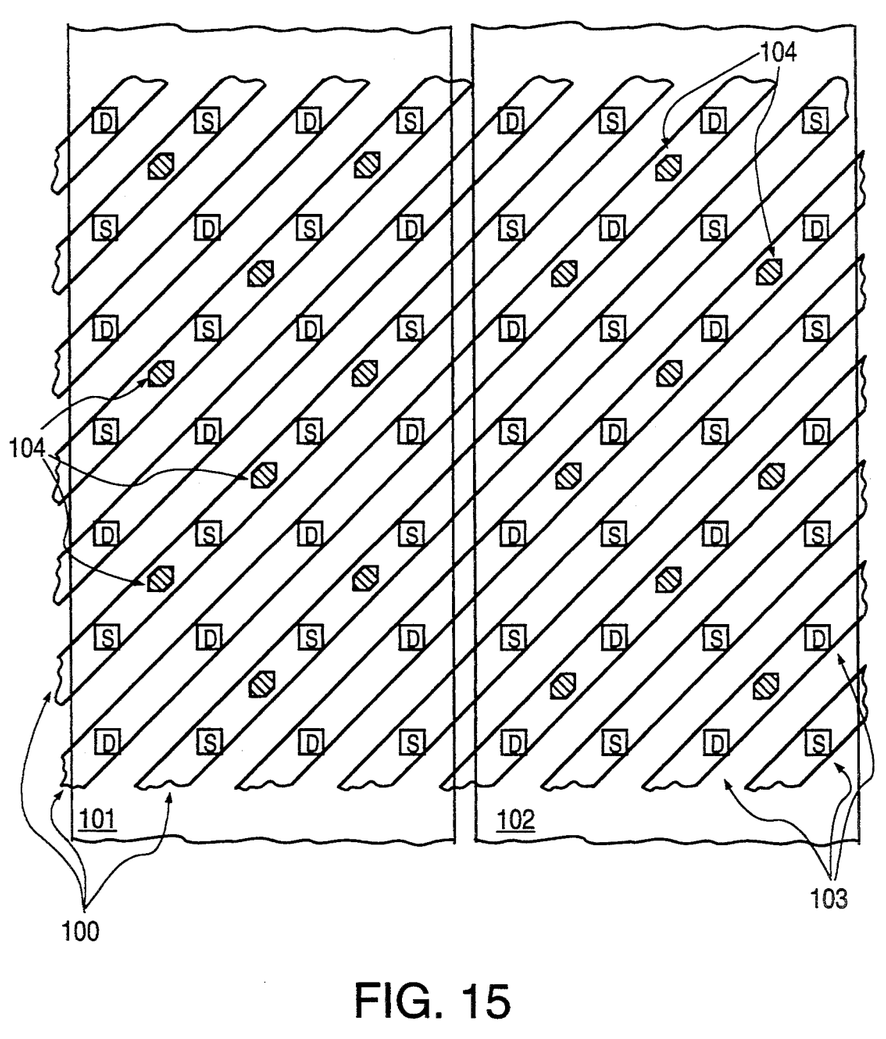
FIG. 15 illustrates a pattern of vias used to interconnect diagonal metal lines to overlying vertical metal lines in accordance with another aspect of the invention.

Illustrated in FIG. 15 is a plan view of a number of diagonal metal lines 100 in a first metal layer overlain by two vertical metal interconnect lines 101 and 102 in a second metal layer. Source and drain cells 103 (designated "S" and "D", respectively) and vias 104 (cross-hatched) extending between the first and second metal layers are also shown. It will be noted that along any given metal line 100, the cells 103 and vias 104 alternate, while the source cells are connected to interconnect line 101 and the drain cells are connected to interconnect line 102. This alternating via/contact layout minimizes the distance which current must flow exclusively in the first metal layer before reaching a via, thereby reducing metal resistance and current density in the metal lines 100.

Numerous alternatives of the embodiments described above will be apparent to those skilled in the art. All such alternative embodiments are intended to be within the scope of this invention, as defined in the following claims.

I claim:

1. A lateral MOSFET comprising:
    a semiconductor substrate having a preselected conductivity;
    a gate layer overlying said substrate;
    a plurality of cells arrayed in an orthogonal pattern on a surface of said substrate, each of said cells comprising a region of semiconductor material having a conductivity different in degree or polarity from the conductivity of the substrate, a generally rectangular opening in said gate layer, and a metal contact extending through said generally rectangular opening and making contact with said region of semiconductor material; and
    a first plurality of metal contact lines extending at an oblique angle to said orthogonal pattern of cells;
    wherein at least some of said metal contacts have a cross-sectional shape which includes a first pair of sides which are parallel to a first pair of edges of said generally rectangular opening, each of said first pair of sides having a first predetermined separation from one of said first pair of edges, said cross-sectional shape of said metal contact further including a second pair of sides which are parallel to a pair of edges of one of said metal contact lines, each of said second pair of sides having a second predetermined separation from one of said pair of edges of one of said metal contact lines.

2. The lateral MOSFET of claim 1 wherein, in at least some of said cells, the cross-sectional shape of said metal contact includes a second pair of sides which are parallel to a second pair of edges of said generally rectangular opening, each of said second pair of sides being separated from one of said second pair of edges by a distance equal to said first predetermined separation.

3. The lateral MOSFET of claim 2 wherein the shape of at least some of the openings in said gate layer is square.

4. The lateral MOSFET of claim 3 wherein some of said cells are source cells, said MOSFET further comprising a body contact region separated from said source cells.

5. The lateral MOSFET of claim 3 wherein some of said cells comprise a source region and a body region, said source region and said body region being shorted together.

6. The lateral MOSFET of claim 3 wherein said substrate is of a first conductivity and wherein said cells include drain cells comprising a drain region of said first conductivity and source/body cells comprising a source region of said first conductivity and a body region of a second conductivity, said substrate being doped to a lesser degree than said drain region.

7. The lateral MOSFET of claim 6 wherein said gate layer overlies substantially the entire area between said drain cells and said source/body cells.

8. The lateral MOSFET of claim 6 wherein said gate layer overlies a channel region included in said body region but overlies only a portion of the area between said drain cells and said source/body cells.

9. The lateral MOSFET of claim 8 wherein part of said gate layer extends over a field oxide layer.

10. The lateral MOSFET of claim 5 wherein some of said cells comprise a drain region, the opening in the gate layer in the cells which comprise a source region and body region being larger than the opening in the gate layer in the cells which comprise a drain region, the cross-sectional shape of the metal contact in only said cells which comprise a source region and a body region being six-sided.

11. The lateral MOSFET of claim 6 wherein the source and body regions in said source/body cells are shorted, the opening in the gate layer in the cells which comprise a source region and a body region being larger than the opening in the gate layer in the cells which comprise a drain region, the cross-sectional shape of the metal contact in only said cells which comprise a source region and a body region being six-sided.

12. The lateral MOSFET of claim 2 further comprising a second plurality of metal lines overlying and oriented at an oblique angle to said first plurality of metal lines, said first and second plurality of metal lines being separated by a dielectric layer, vias extending through said dielectric layer to connect certain ones of said first plurality of lines to certain ones of said second plurality of lines.

13. The lateral MOSFET of claim 12 where the cross-sectional shape of said vias is a parallelogram.

14. The lateral MOSFET of claim 12 where the cross-sectional shape of said vias is six-sided.

15. A lateral MOSFET comprising:
    a first metal line, said first metal line having metal contacts to a series of source or drain cells formed in a substrate underlying said first metal line, said substrate being separated from said first metal line by a first dielectric layer;
    a second metal line overlying said first metal line and separated from said first metal line by a second dielectric layer; and
    a series of vias extending between said first and second metal lines through said second dielectric layer, each of said vias being positioned at a location coincident with a midpoint between an adjacent pair of said cells.

* * * * *

UNITED STATES PATENT AND TRADEMARK OFFICE
CERTIFICATE OF CORRECTION

PATENT NO.    :   5,412,239
DATED         :   May 2, 1995
INVENTOR(S)   :   Richard K. Williams It is certified that error appears in the above-identified patent and that said Letters Patent is hereby corrected as shown below:

```
    Col. 1, line 40, after "must" insert --be--.

Col. 4, line 21, "Fig. 9 illustrates..." begins a new
paragraph.
```

Signed and Sealed this

Twenty-sixth Day of December, 1995

Attest:

BRUCE LEHMAN

*Attesting Officer*     *Commissioner of Patents and Trademarks*